United States Patent [19]
Takahashi et al.

[11] Patent Number: 4,958,101
[45] Date of Patent: Sep. 18, 1990

[54] PIEZOELECTRIC ACTUATOR

[75] Inventors: Takeshi Takahashi, Mishima; Takashi Yamamoto, Susono, both of Japan

[73] Assignee: Toyota Jidosha Kabushiki Kaisha, Japan

[21] Appl. No.: 387,616

[22] Filed: Jul. 28, 1989

[30] Foreign Application Priority Data

| Aug. 29, 1988 | [JP] | Japan | 63-112146[U] |
| Sep. 21, 1988 | [JP] | Japan | 63-234820 |
| Sep. 21, 1988 | [JP] | Japan | 63-122689[U] |

[51] Int. Cl.$^5$ ............................................. H01L 41/08
[52] U.S. Cl. ..................................... 310/328; 123/498; 310/340
[58] Field of Search ............... 310/323, 328, 338, 340, 310/341; 417/322; 239/584, 585; 123/498

[56] References Cited

U.S. PATENT DOCUMENTS

| 3,766,415 | 10/1973 | Dame et al. | 310/328 |
| 3,903,435 | 9/1975 | Bouygves et al. | 310/328 X |
| 4,553,059 | 11/1985 | Abe et al. | 310/328 X |
| 4,782,807 | 11/1988 | Takahashi | 123/506 |
| 4,814,659 | 3/1989 | Sawada | 310/328 |

FOREIGN PATENT DOCUMENTS

| 58-106881 | 6/1983 | Japan. | |
| 59-206668 | 11/1984 | Japan. | |
| 60-19968 | 1/1985 | Japan | 310/328 |
| 63-25841 | 2/1988 | Japan. | |
| 0043383 | 2/1988 | Japan | 310/328 |
| 63-65167 | 3/1988 | Japan. | |
| 63-114062 | 7/1988 | Japan. | |
| 63-158301 | 7/1988 | Japan. | |
| 2193386 | 2/1988 | United Kingdom | 310/328 |

Primary Examiner—Mark O. Budd
Attorney, Agent, or Firm—Kenyon & Kenyon

[57] ABSTRACT

A piezoactuator comprising a housing having a piston bore formed therein. The tip portion of a piston is slidably inserted into the cylinder bore and defines a variable volume chamber therein, and a piezoelectric element is supported between the piston and the housing. A hollow cylindrical resilient member is fitted onto the outer wall of the piston and inserted between the piston and the housing to apply a compression load to the piezoelectric element via the piston. The hollow cylindrical resilient member has a plurality of circumferentially extending slots arranged in a point of symmetry about the axis of the hollow cylindrical resilient member.

15 Claims, 13 Drawing Sheets

PIEZOELECTRIC ACTUATOR

BACKGROUND OF THE INVENTION

1. Field of the Invention

The present invention relates to a piezoelectric actuator.

2. Description of the Related Art

In a known piezoelectric actuator, a piston bore is formed in the actuator housing, a piston is slidably inserted into the piston bore, a variable volume chamber defined by the end face of the piston is formed on one side of the piston, a piezoelectric element is inserted between the actuator housing and the other side of the piston, and a belleville spring is mounted in the variable volume chamber to provide a compression load for the piezoelectric element via the piston (see Japanese Unexamined Patent Publication No. 59-206668). In this piezoelectric actuator, a stack type piezoelectric element made of a plurality of stacked piezoelectric element plates is used and when a charge is applied to the piezoelectric element, whereby the stack type piezoelectric element is expanded, the piston is moved to reduce the volume of the variable volume chamber, and accordingly, the pressure of fuel in the variable volume chamber is increased. When the charge in the stack type piezoelectric element is discharged, whereby the stack type piezoelectric element is contracted, the piston is moved to increase the volume of the variable volume chamber, and accordingly, the pressure of fuel in the variable volume chamber is reduced.

In such a stack type piezoelectric element, however, fine air gaps exist between the piezoelectric element plates, and therefore, when the piezoelectric element begins to expand and the pressure in the variable volume chamber is increased, the expansion of the piezoelectric element is stopped until the fine air gaps are eliminated. Namely, play exists in the piezoelectric element, and a sufficient expansion of the piezoelectric element cannot be obtained due to this play. In addition, to obtain a quick reduction of the fuel pressure in the variable volume chamber in response to the contraction of the piezoelectric element, the piezoelectric element must not move away from the piston. Therefore, in the above-mentioned piezoelectric actuator, a compression load is applied to the piezoelectric element by the belleville spring, via the piston, to eliminate the fine air gaps between the piezoelectric element plates, and as a result, when a charge is applied thereto, the required expansion of the piezoelectric element is obtained. Further, since the piezoelectric element does not move away from the piston when the piezoelectric element is contracted, the volume of the variable volume chamber can be instantaneously increased.

In another known piezoelectric actuator, a spring function is given to a hollow cylindrical member by forming, on the outer circumferential face thereof, a plurality of slots arranged around a point of symmetry in the transverse cross-section of the hollow cylindrical member, a stack type piezoelectric element having an outer diameter smaller than the inner diameter of the hollow cylindrical member is inserted into the interior of the hollow cylindrical member, and the stack type piezoelectric element is supported between plugs screwed into the opposed ends of the hollow cylindrical member (see Japanese Unexamined Patent Publication No. 58-106881). In this piezoelectric actuator, by applying a compression load to the stack type piezoelectric element by the spring force of the hollow cylindrical member, fine air gaps between the piezoelectric elements, and accordingly the play in the expansion of the piezoelectric element, are eliminated.

Where the belleville spring is used as shown in Japanese Unexamined patent publication No. 59-20668, however, since the belleville spring can not apply a uniformly distributed load to the piston, the piston is subjected to an eccentric load. Accordingly, due to this eccentric load imposed on the piston, the piston is inclined relative to the piston bore and a problem arises in that an eccentric wear of the piston will occur. In addition, if the piston is inclined relative to the piston bore, an eccentric load is imposed on the piezoelectric element, and thus another problem arises in that the piezoelectric element will be damaged. Furthermore, in the piezoelectric actuator shown in Japanese Unexamined Patent Publication No. 58-106881, since the hollow cylindrical member functioning as a spring is not supported in any way, the hollow cylindrical member is bent and offset from the center axis thereof, and as a result, an eccentric load is imposed on the piezoelectric element, and the problem of damage to the piezoelectric element arises.

SUMMARY OF THE INVENTION

An object of the present invention is to provide a piezoelectric actuator by which eccentric wear of the piston and damage to the piezoelectric element are prevented.

According to the present invention, there is provided a piezoelectric actuator comprising: a housing having a piston bore formed therein; a piston having a first outer wall portion slidably inserted into the piston bore and a second outer wall portion positioned outside of the piston bore, the piston having at one side thereof an end face which defines a variable volume chamber within the piston bore; a piezoelectric element supported between the housing and the other side of the piston; and a hollow cylindrical resilient member fitted onto the second outer wall portion of the piston and inserted between the housing and the piston to apply a compression load to the piezoelectric element via the piston, the hollow cylindrical resilient member having a plurality of slots formed on an outer airconferential wall thereof and arranged in a point of symmetry about an axis of the hollow cylindrical resilient member.

The present invention may be more fully understood from the description of preferred embodiments of the invention set forth below, together with the accormpanying drawings.

DESCRIPTION OF THE PREFERRED EMBODIMENTS

Figure 1:
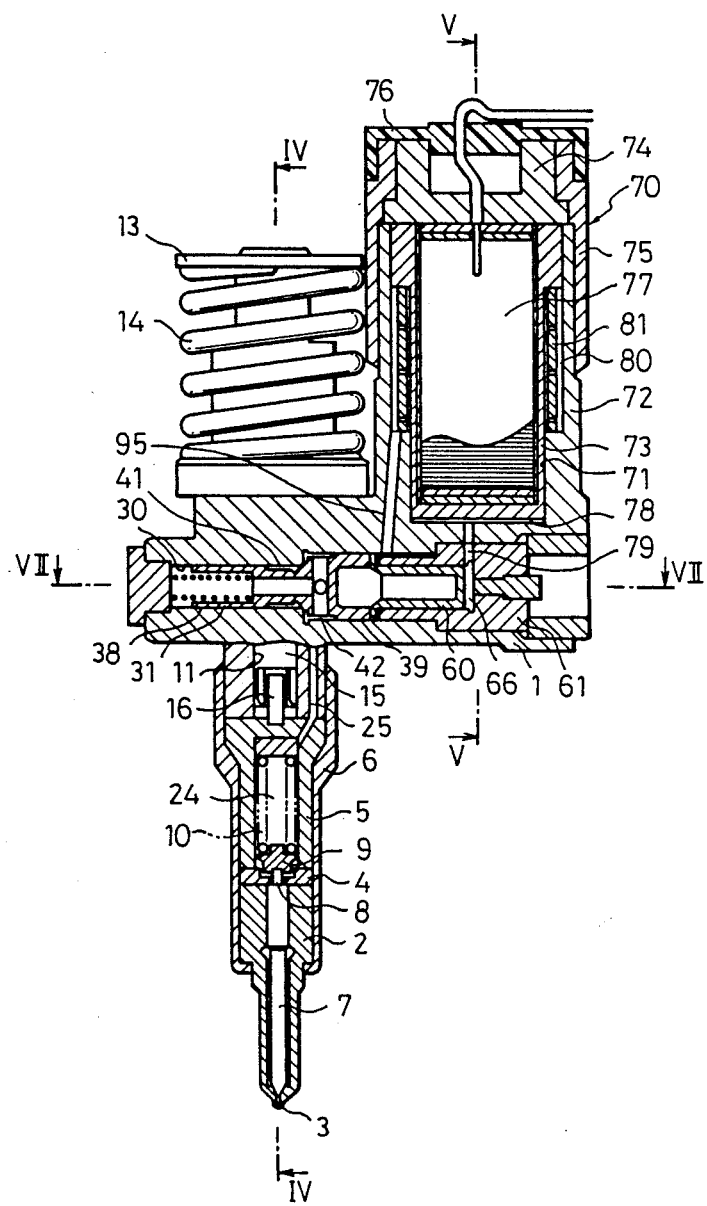
FIG. 1 is a cross-sectional side view of a unit injector, taken along the line I—I in FIG. 4.

FIGS. 1 through 7 illustrate the case where the present invention is applied to a unit injector.

Referring to FIGS. 1 through 4, reference numeral 1 designates a housing body, 2 a nozzle having a nozzle opening 3 at the top portion thereof, 4 a spacer, 5 a sleeve, and 6 a nozzle holder for mounting the nozzle 2, spacer 4, and sleeve 5 to the housing body 1. A needle 7 is slidably inserted in the nozzle 2 and opens and closes the nozzle opening 3. The top of the needle 7 is connected to a spring retainer 9 via a pressure pin 8. The spring retainer 9 is biased downward by a compression spring 10 and this bias force is communicated to the needle 7 through the pressure pin 8. Therefore the needle 7 is biased in the closed direction by the compression spring 10.

Figure 3:
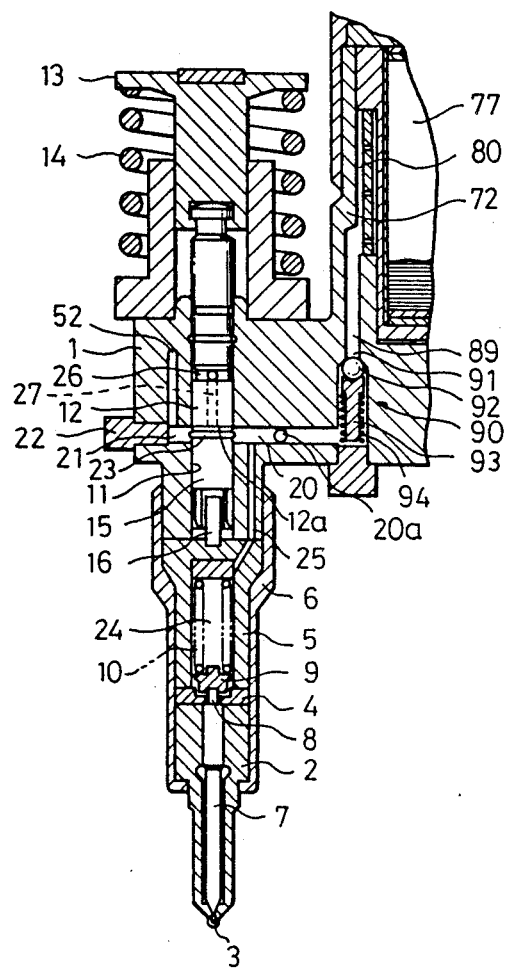
FIG. 3 is a cross-sectional side view of the unit injector, taken along the line III—III in FIG. 4.
Figure 4:
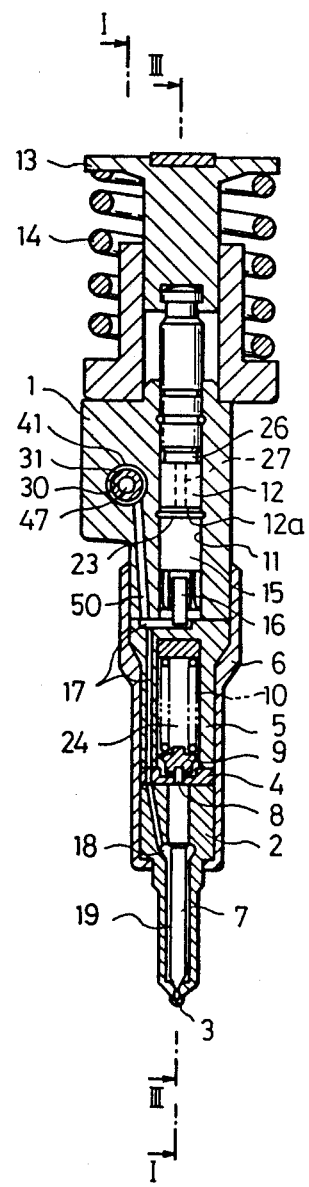
FIG 4 is a cross-sectional side view of the unit injector, taken along the line IV—IV in FIG. 1.

On the other hand, a plunger bore 11 is formed in the housing body 1 coaxially with the needle 7, and a plunger 12 is slidably inserted in this plunger bore 11. The top end of the plunger 12 is connected to a tappet 13, which is biased upward by a compression spring 14. This tappet 13 is moved up and down by an engine camshaft (not shown) and thus the plunger 12 is moved up and down in the plunger bore 11. On the other hand, a high pressure fuel chamber 15 defined by the lower end face 12a of the plunger 12 is formed in the plunger bore 11 under the plunger 12. This high pressure fuel chamber 15 is connected to a pressurized fuel reservoir 18 via a rod filter 16 and a fuel passage 17 (FIG. 4). The pressurized fuel reservoir 18 is connected to the nozzle opening 3 through an annular fuel passage 19 around the needle 7. Further, a fuel supply port 20 is formed in the inner wall of the plunger bore 11 and is open to the high pressure fuel chamber 15 when the plunger 12 is in the upper position, as shown in FIG. 3. Fuel having a feed pressure of about 2 to 3 kg/cm$^2$ is supplied from the fuel supply port 20 to the high pressure fuel chamber 15. The fuel supply port 20 is connected to, for example, a fuel tank (not shown) via a fuel discharge passage 20a extending perpendicular from the fuel supply port 20 and via a relief valve (not shown) which is opened when the pressure is higher than about 2 to 3 kg/cm$^2$.

As illustrated in FIG. 3, a fuel port 21, formed when the boring operation of the fuel supply port 20 is carried out, is formed on the side opposite to the fuel supply port 20 with respect to the plunger bore 11, and the outer end portion of the fuel port 21 is closed by a blind plug 22. This fuel port 21 extends coaxially with the fuel supply port 20 and is open to the plunger bore 11. A circumferential groove 23 is formed on the inner wall of the plunger bore 11 and extends from the fuel supply port 20 to the fuel port 21. Consequently, when the plunger 12 moves downward and closes both the fuel supply bore 20 and the fuel port 21, the fuel port 21 is interconnected to the fuel supply port 22 via the circumferential groove 23, and thus the fuel in the fuel port 21 is maintained at a pressure which is the same as the feed pressure in the fuel supply port 20. A compression spring receiving chamber 24 receiving therein the compression spring 10 used for biasing the needle 7 is connected to the fuel supply port 20 via a fuel return passage 25, and the fuel which has leaked into the compression spring receiving chamber 24 is returned to the fuel supply port 20 via the fuel return passage 25. A circumferential groove 26 is formed on the outer circumferential wall of the plunger 12 at a position which is slightly higher than the lower end face 12a of the plunger 12, and thus the circumferential groove 26 is connected to the high pressure fuel chamber 15 via a fuel escaping bore 27 formed in the plunger 12.

Figure 2:
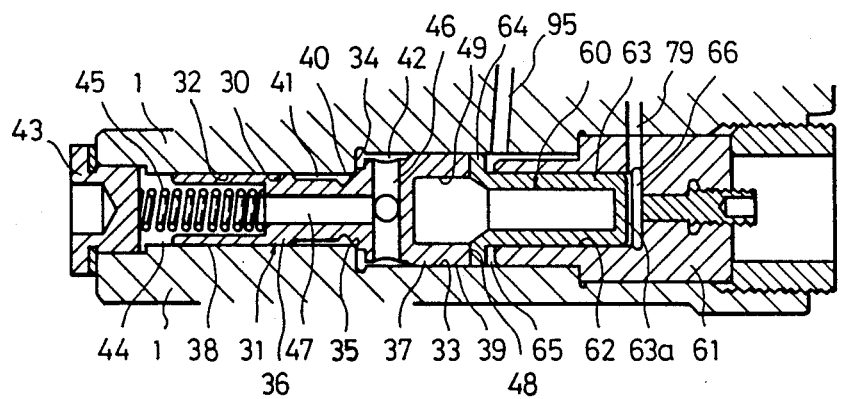
FIG. 2 is an enlarged cross-sectional side view of a portion of, the unit injector.

On the other hand, a bore 30 is formed in the housing body 1 and extended in the horizontal plane near the plunger bore 11. Namely, the bore 30 is formed so that the axis thereof is parallel to and spaced from a line which is substantially at a right angle to a common axis of the plunger 12 and needle 7. A spill valve 31 is slidably inserted in the bore 30. As illustrated in FIGS. 1 and 2, the bore 30 comprises a reduced diameter bore portion 32 and an increased diameter bore portion 33 which are coaxially arranged, and a step portion 34 extending perpendicular to the common axis of the reduced diameter bore portion 32 and the increased diameter bore portion 33 is formed between the reduced diameter bore portion 32 and the increased diameter bore portion 33. An annular valve seat 35 is formed at the connecting portion of the step portion 34 and the reduced diameter bore portion 32.

The spill valve 31 comprises a reduced diameter portion 36 located in the reduced diameter bore portion 32, and an increased diameter portion 37 located in the increased diameter bore portion 33. A first annular fitting portion 38, which is in tight contact with the inner wall of the reduced diameter bore portion 32, is formed at the outer end of the reduced diameter portion 36, and a second annular fitting portion 39, which is in tight contact with the inner wall of the increased diameter bore portion 33, is formed at the outer end of the increased diameter bore portion 37. An annular valve portion 40, which can be seated on the valve seat 35, is formed on the outer circumferential wall of the spill valve 31 between the first annular fitting portion 38 and the second annular fitting portion 39. An annular high pressure fuel introduction chamber 41 is formed around the outer circumferential wall of the spill valve 31 between the annular valve portion 40 and the first annular fitting portion 38, and an annular fuel spill chamber 42 is formed around the outer circumferential wall of the spill valve 31 between the annular valve portion 40 and the second annular fitting portion 39.

As illustrated in FIG. 2, a portion of the outer circumferential wall of the increased diameter portion 37, which portion defines the fuel spill chamber 42, has a larger diameter than that of the reduced diameter bore portion 32, and thus the fuel spill chamber 42 has a relatively small volume. The outer end portion of the reduced diameter portion 32 is closed by a blind plug 43, and a spill valve back pressure chamber 44 is formed between the blind plug 43 and the spill valve 31. A compression spring 45 is inserted in the spill valve back pressure chamber 44 to bias the spill valve 31 in a direction in which the annular valve portion 40 of the spill valve 31 moves away from the valve seat 35, i.e., to bias the spill valve 31 in the open direction. A radially extended fuel passage 46, which is open to the fuel spill chamber 42, is formed in the increased diameter portion 37 of the spill valve 31, and an axially extended fuel passage 47 which is open to the spill valve back pressure chamber 44 is formed in the reduced diameter portion 36 of the spill valve 31. These fuel passages 46 and 47 are interconnected within the spill valve 31, and thus the spill valve back pressure chamber 44 is connected to the fuel spill chamber 42 via both the fuel passages 46 and 47. A recess 49, which extends to the vicinity of the fuel passage 46, is formed on the central portion of the end face 48 of the spill valve 31, which end face 48 is located on the second annular fitting portion side. As mentioned above, since the recess 49 and the fuel passages 46, 47 are formed in the spill valve 31, the mass of the spill valve 31 is considerably reduced.

Figure 7:
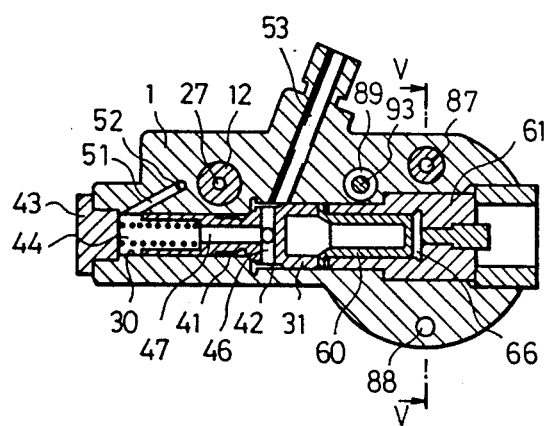
FIG. 7 is a cross-sectional plan view of the unit injector, taken along the line VII—VII in FIG. 1.

As illustrated in FIG. 4, a fuel spill passage 50 extending upward from the fuel passage 17 and continuously open to the high pressure fuel introduction chamber 41 is formed in the housing body 1. This fuel spill passage 50 is continuously connected to the high pressure fuel chamber 15, and thus the high pressure fuel introduction chamber 41 is continuously connected to the high pressure fuel chamber 15. In addition, as illustrated in FIG. 7, the spill valve back pressure chamber 44 is connected to a vertically extending fuel passage 52 via a fuel passage 51 and, as illustrated in FIG. 7, the lower end of the fuel passage 52 is connected to the fuel passage 21. Furthermore, as illustrated in FIG. 7, the fuel spill chamber 42 is connected to a fuel discharge passage 53, and fuel discharged from the fuel discharge passage 53 is returned, for example, to a fuel tank (not shown).

As illustrated in FIGS. 1 and 2, a rod guide 61 having a rod bore 62 therein for supporting and guiding a rod 60, is fitted into the outer end of the increased diameter bore portion 33 of the bore 30. The rod 60 comprises a hollow cylindrical reduced diameter portion 63 slidably inserted into the rod bore 62, and an increased diameter portion 64 slidably inserted into the increased diameter bore portion 33, and the end face of the increased diameter portion 64 is caused to abut against the end face 48 of the spill valve 31. A rod back pressure chamber 65 is formed between the inner end of the rod guide 61 and the increased diameter portion 64 of the rod 60, and a pressure control chamber 66 defined by the end face 63a of the reduced diameter portion 63 is formed at the end portion of the rod 60, which is located opposite to the increased diameter portion 64. An actuator 70 is arranged above the pressure control chamber 66.

As can be seen from FIGS. 1 and 2, the rod 60 has a hollow cylindrical shape, and thus the mass of the rod 60 is considerably reduced.

Figure 5:
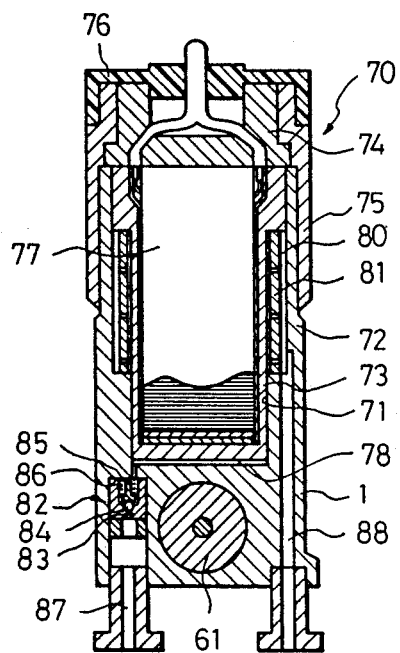
FIG. 5 is a cross-sectional side view of the unit injector, taken along the line V—V in FIGS. 1 and 7.
Figure 6:
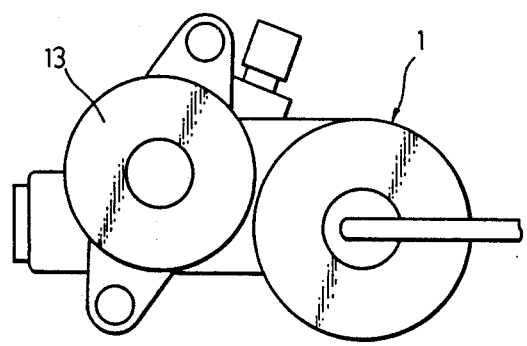
FIG. 6 is a plan view of the unit injector.

As illustrated in FIGS. 1 and 5, the actuator 70 comprises an actuator housing 72 integrally formed with the housing body 1 and forming a piston bore 71 therein, a hollow cylindrically shaped piston 73 slidably inserted into the piston bore 71, an end plate 74 covering the top portion of the actuator housing 72, an end plate holder 75 for fixing the end plate 74 to the top portion of the actuator housing 72, and a cap 76 covering the upper end portion of the end plate 74 and made of a plastic. A stack type piezoelectric element 77 made of a plurality of stacked piezoelectric element plates is inserted between the piston 73 and the end plate 74, and a variable volume chamber 78 defined by the lower end face of the piston 73 is formed in the piston bore 71 beneath the piston 73 and is connected to the pressure control chamber 66 via a fuel passage 79. An annular cooling chamber 80 is formed between the piston 73 and the actuator housing 72, and a hollow cylindrical resilient member 81 is inserted into the cooling chamber 80 to bias the piston 73 upward. Accordingly, when a charge is applied to the piezoelectric element 77, the piezoelectric element 77 expands axially, and as a result, the volume of the variable volume chamber 78 is reduced, and when the charge of the piezoelectric element 32 is discharged, the piezoelectric element 32 is axially contracted, and as a result, the volume of the variable volume chamber 78 is increased.

As illustrated in FIG. 5, a check valve 82 is inserted in the housing body 1. This check valve 82 is provided with a ball 84 for opening and closing a valve port 83, a rod 85 for restricting the amount of lift of the ball 84, and a compression spring 86 for biasing the ball 84 and rod 85 downward, and therefore, the valve port 83 is normally closed by the ball 84. The valve port 83 of the check valve 82 is connected, for example, to a low pressure fuel pump (not shown) via a fuel inflow passage 87, and fuel having a low pressure of 2 to 3 kg/cm$^2$ is fed from the fuel inflow passage 87. The check valve 82 permits only the inflow of fuel into the variable volume chamber 78, and thus when the pressure of fuel in the variable volume chamber 78 falls below 2 to 3 kg/cm$^2$, additional fuel is supplied to the variable volume chamber 78. Therefore, the variable volume chamber 78 is always filled with fuel.

As illustrated in FIG. 5, the lower end portion of the cooling chamber 80 is connected, for example, to a low pressure fuel pump (not shown) via a fuel inflow passage 88, and fuel having a low pressure of 2 to 3 kg/cm$^2$ is supplied to the cooling chamber 80 from the fuel inflow passage 88. The piezoelectric element 77 is cooled by this fuel. In addition, as illustrated in FIG. 3, the lower end portion of the cooling chamber 80 is connected to the fuel supply port 20 via a fuel outflow passage 89, and a check valve 90 permitting only the flow of fuel from the cooling chamber 80 toward the fuel supply port 20 is arranged in the fuel outflow passage 89. This check valve 90 comprises a ball 92 for opening and closing a valve port 91, a rod 93 for restricting the amount of lift of the ball 92, and a compression spring 94 for biasing the ball 92 and the rod 93 upward. Fuel in the cooling chamber 80 is fed into the fuel supply passage 20 via the fuel outflow passage 89, after cooling the piezoelectric element 77. Furthermore, as illustrated in FIGS. 1 and 2, the lower end portion of the cooling passage 80 is connected to the rod back pressure chamber 65 via a fuel passage 95, and thus in this embodiment the rod back pressure chamber 65 is filled with fuel having a pressure of 2 to 3 kg/cm².

Figure 8:
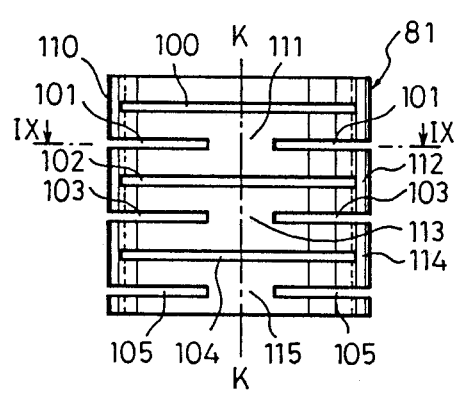
FIG. 8 is a side view of the hollow cylindrical resilient member.
Figure 9:
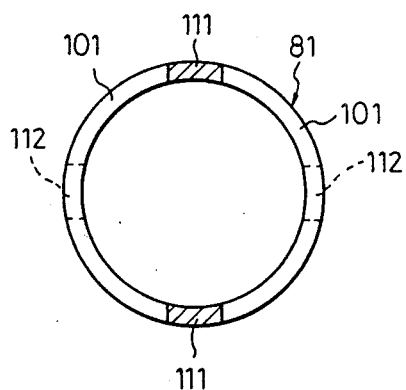
FIG. 9 is a cross-sectional plan view of the hollow cylindrical resilient member, taken along the line IX—IX in FIG. 8.

As described above and as illustrated in FIGS. 1 and 5, the hollow cylindrical resilient member 81 is inserted into the cooling chamber 80 formed in the actuator housing 72 to bias the piston 73 upward. As illustrated in FIGS. 8 and 9, this hollow cylindrical resilient member 81 has a uniform thin wall over the entire length thereof and has a uniform inner diameter and a uniform outer diameter over the entire length thereof. A plurality of slot groups comprising a pair of circumferential slots which extend in the circumferential direction of the hollow cylindrical resilient member 81 are formed on the outer circumferential wall of the hollow cylindrical resilient member 81. That is, a slot group of a pair of circumferential slots 100, a slot group of a pair of circumferential slots 101, a slot group of a pair of circumferential slots 102, a slot group of a pair of circumferential slots 103, a slot group of a pair of circumferential slots 104, and a slot group of a pair of circumferential slots 105 are formed on the outer circumferential wall of the hollow cylindrical resilient member 81, and each of the slot groups is equidistant from each of the other slot groups in the axial direction of the hollow cylindrical resilient member 81. Each of the slots 100, 101, 102, 103, 104 and 105 is extended through the wall of the hollow cylindrical resilient member 81 from the outer circumferential face thereof to the inner circumferential face thereof, and bridge portions 110, 111, 112, 113, 114 and 115 are formed between the slots 100, between the slots 101, between the slots 102, between the slots 103, between the slots 104, and between the slots 105, respectively. Each of the pair of slots 100, 101, 102, 103, 104, and 105 is arranged in a point of symmetry about the central axis K of the hollow cylindrical resilient member 81, and each of the pair of slots 100, 101, 102, 103, 104 and 105 is extended equiangulary about the central axis K of the hollow cylindrical resilient member 81. Consequently, each of the bridge portions 110, 111, 112, 113, 114 and 115 is also arranged in a point of symmetry and extended equiangulary about the central axis K of the hollow cylindrical resilient member 81. In addition, the positions of the slots of the adjacent two slot groups are deviated from each other by an angle obtained by dividing 180° by the number N of the slots included in each slot group, i.e., one is deviated from the other by 90° (=180°/2) in the embodiment illustrated in FIGS. 8 and 9. In addition, in the embodiment illustrated in FIGS. 8 and 9, all of the pairs of slots 100, 101, 102, 103, 104 and 105 have the same width.

Figure 10:
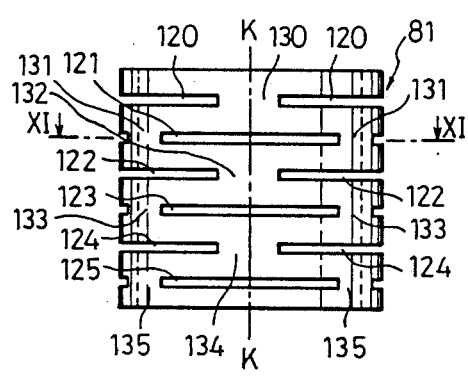
FIG. 10 is a side view of a second embodiment of the hollow cylindrical resilient member.
Figure 11:
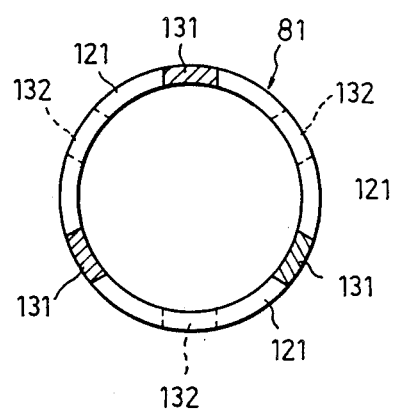
FIG. 11 is a cross-sectional plan view of the hollow cylindrical resilient member, taken along the line XI—XI in FIG. 10.

FIGS. 10 and 11 illustrates an alternative embodiment of the hollow cylindrical resilient member 81. In this embodiment, a plurality of slot groups comprising three circumferential slots extending in the circumferential direction of the hollow cylindrical resilient member 81 are formed on the outer circumferential wall of the hollow cylindrical resilient member 81. Namely, a slot group of three circumferential slots 120, a slot group of three circumferential slots 121, a slot group of three circumferential slots 122, a slot group of three circumferential slots 123, a slot group of three circumferential slots 124, and a slot group of three circumferential slots 125 are formed on the outer circumferential wall of the hollow cylindrical resilient member 81, and each of the slot groups is equidistant from each of the other slot groups in the axial direction of the hollow cylindrical resilient member 81. Each of the slots 120, 121, 122, 123, 124 and 125 is extended through the wall of the hollow cylindrical resilient member 81 from the outer circumferential face thereof to the inner circumferential face thereof, and bridge portions 130, 131, 132, 133, 134 and 135 are formed between the slots 120, between the slots 121, between the slots 122, between the slots 123, between the slots 124 and between the slots 125, respectively. Each of the three slots 120, 121, 122, 123, 124 and 125 is arranged in a point of symmetry about the central axis K of the hollow cylindrical resilient member 81, and each of the slots 120, 121, 122, 123, 124 and 125 is extended equiangulary about the central axis K of the hollow cylindrical resilient member 81. Consequently, each of the bridge portions 130, 131, 132, 133, 134 and 135 is also arranged in a point of symmetry and extended equiangulary about the central axis K of the hollow cylindrical resilient member 81. In addition, the positions of the slots of the adjacent two slot groups are deviated from each other by 60° (=180°/3) in the embodiment illustrated in FIGS. 10 and 11. In addition, in the embodiment illustrated in FIGS. 10 and 11, all of the slots 120, 121, 122, 123, 124 and 125 have the same width.

The hollow cylindrical resilient member 81 illustrated in FIGS. 8 through 11 has a good linearity from the aspect of the relationship between a load and a strain, over a wide load range. As illustrated in FIGS. 1 and 5, this hollow cylindrical resilient member 81 is fitted onto the outer circumferential wall of the piston 73 while the hollow cylindrical resilient member 81 is compressed, and thus the compression load is applied to the piezoelectric element 77 via the piston 73 by the spring force of the hollow cylindrical resilient member 81. The hollow cylindrical resilient member 81 is fitted onto and in tight contact with the outer circumferential wall of the piston 73, and thus the hollow cylindrical resilient member 81 is held in place by the outer circumferential wall of the piston 73. As a result, the central axis K of the hollow cylindrical resilient member 81 cannot be bent out of alignment. Therefore, a uniformly distributed load is imposed on the piston 73 by the hollow cylindrical resilient member 81, i.e., an eccentric load cannot be imposed on the piston 73, and thus the piston 73 cannot be inclined relative to the axis of the piston bore 71, and accordingly, eccentric wear of the piston 73 is prevented. Further, since the piston 73 is not inclined relative to the piston bore 71, an eccentric load is not imposed on the piezoelectric element 77, and thus damage to the piezoelectric element 77 is prevented.

As mentioned above, fuel is supplied to the cooling chamber 80 via the fuel inflow chamber 88, and after cooling the piezoelectric element 77, the fuel is fed into the fuel supply port 20 via the fuel outflow passage 89 and the check valve 90. When the plunger 12 is at the upper position as shown in FIG. 3, fuel is supplied to the high pressure fuel chamber 15 from the fuel supply port 20, and therefore, the pressure in the high pressure fuel chamber 15 is a low pressure of about 2 to 3 kg/cm². On the other hand, at this time the piezoelectric element 77 is fully contracted, and thus the fuel pressure in the variable volume chamber 78 and the pressure control chamber 66 is a low pressure of about 2 to 3 kg/cm². Therefore, the spill valve 31 is moved to the right in FIGS. 1 and 2 by the compression spring 45 and the annular valve portion 40 is moved away from the valve seat 35, i.e., the spill valve 31 is opened. Consequently, low pressure fuel in the high pressure fuel chamber 15 is fed into the fuel spill chamber 42, on one hand via the fuel spill passage 50 and the high pressure fuel introduction chamber 41, and on the other hand via the spill valve back pressure chamber 44 and the fuel passages 47, 46 of the spill valve 31, and the fuel fed into the fuel spill chamber 42 is discharged from the fuel discharge passage 53. Consequently, at this time, the high pressure fuel introduction chamber 41, the fuel spill chamber 42, and the spill valve back pressure chamber 44 are also filled with low pressure fuel having a pressure of 2 to 3 kg/cm$^2$.

When the plunger 12 is moved downward, the fuel supply port 20 and the fuel port 21 are closed by the plunger 12, but since the spill valve 31 is open, the fuel in the high pressure fuel chamber 15 flows out into the fuel spill chamber 42 via the fuel spill passage 50 and the high pressure fuel introduction chamber 41 of the spill valve 31. Consequently, also at this time, the pressure of fuel in the high pressure fuel chamber 15 is a low pressure of about 2 to 3 kg/cm$^2$.

When a charge is given to the piezoelectric element 77 to start the fuel injection, the piezoelectric element 77 expands axially, and as a result, the piston 73 is moved downward, and thus the fuel pressure in the variable volume chamber 78 and the pressure control chamber 66 is rapidly increased. When the fuel pressure in the pressure control chamber 66 is increased, the rod 60 is moved to the left in FIGS. 1 and 2, and therefore, the spill valve 31 is also moved to the left, and as a result, the annular valve portion 40 of the spill valve 31 abuts against the valve seat 35, and thus the spill valve 31 is closed. When the spill valve 31 is closed, the fuel pressure in the high pressure fuel chamber 15 is rapidly increased due to the downward movement of the plunger 12, and when the fuel pressure in the high pressure fuel chamber 15 exceeds a predetermined pressure, for example, 1500 kg/cm$^2$ or more, the needle 7 is opened and fuel is injected from the nozzle opening 3. At this time, a high pressure is also applied to the high pressure fuel introduction chamber 41 of the spill valve 31 through the fuel spill passage 50, but the pressure receiving areas of the two axial end surfaces of the high pressure fuel introduction chamber 41 are equal, and thus a drive force does not act on the spill valve 31.

When the charge of the piezoelectric element 77 is discharged to stop the fuel injection, the piezoelectric element 77 is contracted, and as a result, the piston 73 is moved upward by the compression spring 81, and therefore, the fuel pressure in the variable volume chamber 78 and the pressure control chamber 66 is reduced. As mentioned earlier, the masses of the rod 60 and the spill valve 31 are small, and therefore, when the fuel pressure in the pressure control chamber 66 is reduced, the rod 60 and the spill valve 31 are immediately moved to the right in FIGS. 1 and 2 by the spring force of the compression spring 45, and as a result, the annular valve portion 40 of the spill valve 31 is moved away from the valve seat 35, and thus the spill valve 31 is immediately opened.

When the spill valve 31 is opened, the fuel under a high pressure in the high pressure fuel chamber 15 is spouted into the fuel spill chamber 42 via the fuel spill passage 50 and the high pressure fuel introduction chamber 41 and thus the fuel pressure in the high pressure fuel chamber 15 rapidly drops.

Since the volume of the fuel spill chamber 15 is small, when the fuel under high pressure is spouted into the fuel spill chamber 42 as mentioned above, the fuel pressure in the fuel spill chamber 42 is temporarily very high. As mentioned earlier, since the second annular fitting portion 39 is formed between the fuel spill chamber 42 and the end face 48 of the increased diameter portion 37 of the spill valve 31, the high pressure generated in the fuel spill chamber 42 does not act on the end face 48 of the increased diameter portion 37 of the spill valve 31, and as a result, this high pressure generated in the fuel spill chamber 42 acts on the cross-sectional area remaining after the cross-sectional area of the reduced diameter bore portion 32 is subtracted from the cross-sectional area of the increased diameter bore portion 33, only in a direction wherein the spill valve 31 is opened, and thus the spill valve 31 is urged in the open direction thereof due to the high pressure generated in the fuel spill chamber 42. In addition, when the fuel under high pressure is spouted into the fuel spill chamber 42, a part of this fuel under high pressure is spouted into the spill valve back pressure chamber 44 from the fuel passage 47 via the fuel passage 46 of the spill valve 31. When the fuel under high pressure is spouted from the fuel passage 47 as mentioned above, a force urging the spill valve 31 in the open direction thereof acts on the spill valve 31 due to the reaction force of the spouting operation of the fuel. Furthermore, when the fuel under high pressure is spouted into the spill valve back pressure chamber 44, the fuel pressure in the spill valve back pressure chamber 44 is increased, and as a result, a force urging the spill valve 31 in the open direction thereof acts on the spill valve 31 due to the fuel pressure in the spill valve back pressure chamber 44. As mentioned above, when the spill valve 31 is opened, a force urging the spill valve 31 in the open direction thereof acts on the spill valve 31 due to an increase in the pressure of fuel in the fuel spill chamber 42, the spouting of fuel from the fuel passage 47, and an increase in the pressure of fuel in the spill valve back pressure chamber 44, and as a result, the spill valve 31 is rapidly opened as soon as the annular valve portion 40 thereof is moved away from the valve seat 35, and in addition, once the spill valve 31 is opened, it remains open. Consequently, when the spill valve 31 is opened, the fuel pressure in the high pressure fuel chamber 15 drops continuously and rapidly, and as a result, when the spill valve 31 is opened, the needle 7 is immediately moved down and the injection of fuel is stopped.

When the piezoelectric element 77 is contracted to open the spill valve 31, and accordingly the fuel pressure in the variable volume chamber 78 is reduced, if the fuel pressure in the variable volume chamber 78 falls below the fuel pressure in the fuel inflow passage 87 (FIG. 5), additional fuel under a low pressure is supplied to the variable volume chamber 78 via the check valve 82.

When the plunger 12 is further moved downward, the circumferential groove 26 formed on the outer circumferential wall of the plunger 12 is in communication with the fuel supply port 20 and the fuel port 21, and at this time, the spill valve 31 is normally open. But, when the spill valve 31 is kept closed for some reason, the fuel pressure in the high pressure fuel chamber 15 remains high, and therefore, when the circumferential groove 26 is in communication with the fuel supply port 20 and the fuel port 21, the fuel under high pressure in the high pressure fuel chamber 15 is spouted into the fuel supply port 20 and the fuel port 21. At this time, the fuel under high pressure spouted into the fuel supply port 20 and the fuel port 21 cannot flow into the cooling chamber 80 due to the presence of the check valve 90, and thus flows into the spill valve back pressure chamber 44 via the fuel passages 51 and 52 and then into the fuel spill chamber 42 via the fuel passages 46 and 47 of the spill valve 31, and as a result, since the fuel pressure in the spill valve back pressure chamber 46 and the fuel spill chamber 42 becomes high, a strong force urging the spill valve 31 in the open direction thereof acts on the spill valve 31, and thus the spill valve 31 is forcibly opened. Therefore, the circumferential groove 26 acts as a failsafe factor preventing an unwanted closure of the spill valve 31.

Then the plunger 12 is moved upward and returned to the uppermost position, and subsequently, the plunger 12 begins to move downward. Accordingly, although a powerful downward drive force is applied to the plunger 12 so that the fuel pressure of the high pressure fuel chamber 15 is increased to 1500 kg/cm$^2$ or more, the bore 30 is arranged at the side of the plunger 12 and is not deformed, and thus a smooth sliding action of the spill valve 31 is ensured. Further, the bore 30 is extended horizontally at the side of the plunger 12, and therefore, the bore 30 can be located near the high pressure fuel chamber 15. As a result, the length of the fuel spill passage 50 can be shortened and thus the volume of the high pressure fuel chamber 15, which includes the fuel spill passage 50, can be reduced. Therefore, the fuel pressure in the high pressure fuel chamber 15 is easily increased to a high level, and thus the injected fuel is properly atomized. Further, since the volume of the high pressure fuel chamber 15 can be reduced, the fuel pressure in the high pressure fuel chamber 15 is immediately reduced when the spill valve 31 is opened, and thus the fuel injection is immediately stopped. Accordingly, when the spill valve 31 is opened, the fuel injection does not continue under a low pressure, and thus the generation of smoke is suppressed and the engine output and the fuel consumption rate are improved. Moreover, the amount of fuel injection is immediately increased and the fuel injection is immediately stopped by the opening and closing of the spill valve 31, and therefore, a correct pilot injection is made.

Because the bore 30 extends horizontally at the side of the plunger 12, the lateral width of the unit injector can be reduced, and further, by arranging the piezoelectric element 77 so that the axis thereof is substantially at a right angle to the common axis of the bore 30 and rod 60, i.e., substantially at a right angle to the common axis of the plunger 12 and needle 7, the lateral width of the unit injector can be further reduced.

FIGS. 12, 13, 16, 17 and 18 illustrate improved embodiments of the hollow cylindrical resilient member 81.

Figure 12:
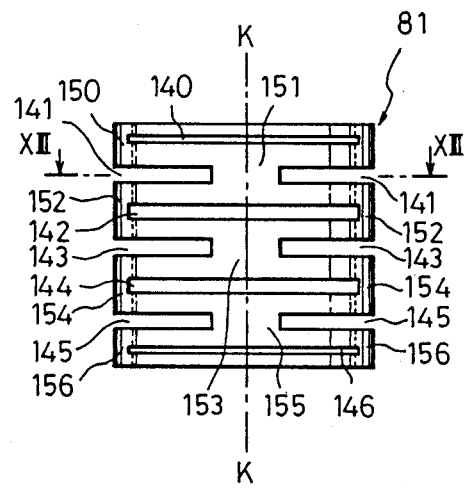
FIG. 12 is a side view of a third embodiment of the hollow cylindrical resilient member.
Figure 13:
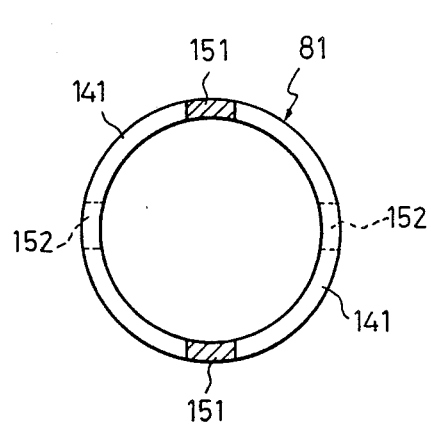
FIG. 13 is a cross-sectional plan view of the hollow cylindrical resilient member, taken along the line XIII—XIII in FIG. 12.

Referring to FIGS. 12 and 13, in this embodiment, a plurality of slot groups comprising a pair of circumferential slot extending in the circumferential direction of the hollow cylindrical resilient member 81 are formed on the outer circumferential wall of the hollow cylindrical resilient member 81. Namely, a slot group of a pair of circumferential slots 140, a slot group of a pair of circumferential slots 141, a slot group of a pair of circumferential slots 142, a slot group of a pair of circumferential slots 143, a slot group of a pair of circumferential slots 144, a slot group of a pair of circumferential slots 145, and a slot group of a pair of circumferential slots 146 are formed on the outer circumferential wall of the hollow cylindrical resilient member 81. Each of the slot groups is equidistant from each of the other slot groups in the axial direction of the hollow cylindrical resilient member 81. Each of the slots 140, 141, 142, 143, 144, 145 and 146 is extended through the wall of the hollow cylindrical resilient member 81 from the outer circumferential face thereof to the inner circumferential face thereof, and bridge portions 150, 151, 152, 153, 154, 155 and 156 are formed between the slots 140, between the slots 141, between the slots 142, between the slots 143, between the slots 144, between the slots 145 and between the slots 146, respectively. Each of the pair of the slots 140, 141, 142, 143, 144, 145 and 146 is arranged in a point of symmetry about the central axis K of the hollow cylindrical resilient member 81, and each of the slots 140, 141, 142, 143, 144, 145 and 146 is extended equiangulary about the central axis K of the hollow cylindrical resilient member 81. Consequently, each of the bridge portions 150, 151, 152, 153, 154, 155 and 156 is also arranged in a point of symmetry and extended equiangulary about the central axis K of the hollow cylindrical resilient member 81. In addition, the positions of the slots of the adjacent two slot groups are deviated from each other by 90° (=180°/2) in the embodiment illustrated in FIGS. 12 and 13. In addition, in the embodiment illustrated in FIGS. 12 and 13, the slots 141, 142, 143, 144 and 145 other than the outermost slots 140 and 146 in the axial direction of the hollow cylindrical resilient member 81 have approximately the same width, and the width of the outermost slots 140 and 146 is smaller than the width of the remaining slots 141, 142, 143, 144 and 145.

Next, the reason why the outermost slots 140 and 146 have a smaller width than the width of the remaining slots will be described with reference to FIGS. 14 and 15.

Figure 14A:
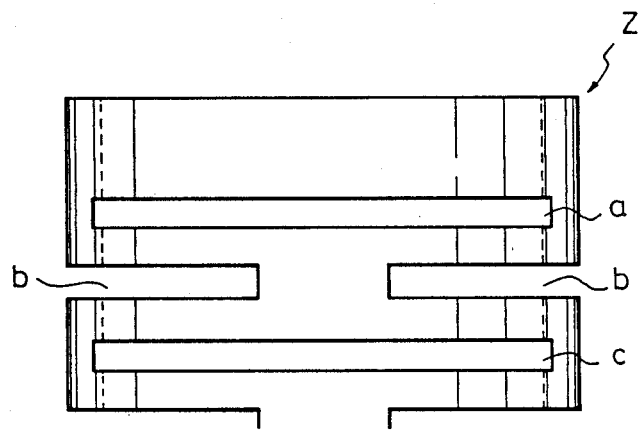
FIG. 14 is an enlarged side view of the top portion of the hollow cylindrical resilient member.
Figure 14B:
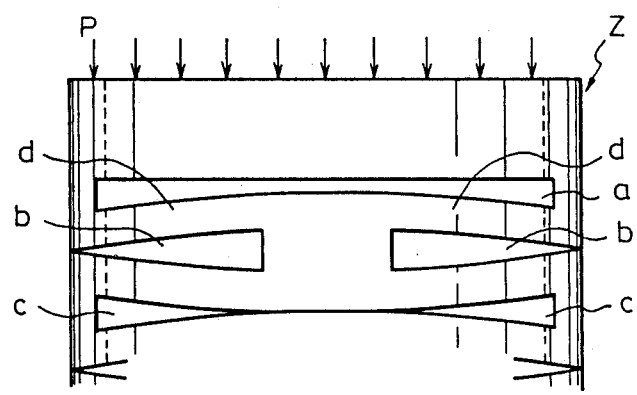

FIG. 14 illustrates the hollow cylindrical resilient member Z in which all of the slots a, b, and c have the same width. In this hollow cylindrical resilient member Z, when the axial load P is imposed on the hollow cylindrical resilient member Z as illustrated in FIG. 14B, the upper edges and the lower edges of the slots b and c are bent inward toward each other, and finally, the central portions of the upper edges of the slots b and c come into contact with the central portions of the lower edges of the slots b and c, as illustrated in FIG. 14B. Nevertheless, when the axial load P is imposed on the hollow cylindrical resilient member Z, the upper edge of the outermost slot a is not bent, i.e., only the lower edge of the slot a is bent inward to approach the upper edge thereof. Consequently, even if the central portions of the upper edges of the slots b and c come into contact with the central portions of the lower edges thereof, the central portion of the lower edge of the slot a does not come into contact with the central portion of the upper edge of the slot a. Thereafter, when the axial load P is further increased, the central portion of the lower edge of the slot a finally comes into contact with the central portion of the upper edge of the slot a. At this time, the amount of deformation of a portion d of the hollow cylindrical resilient member Z, which portion defines the lower edge of the slot a, becomes excessive compared with the other portions, and as a result, an excessively high stress is generated in this portion d, and thus the portion d may be damaged.

In the embodiment illustrated in FIGS. 12 and 13, an improvement is applied to the hollow cylindrical resilient member 81 to avoid the above possibility.

Figure 15A:
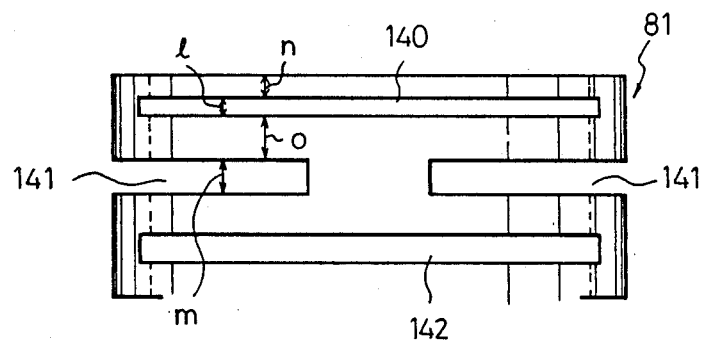
FIG. 15 is an enlarged side view of the top portion of the hollow cylindrical resilient member illustrated in FIG. 12.
Figure 15B:
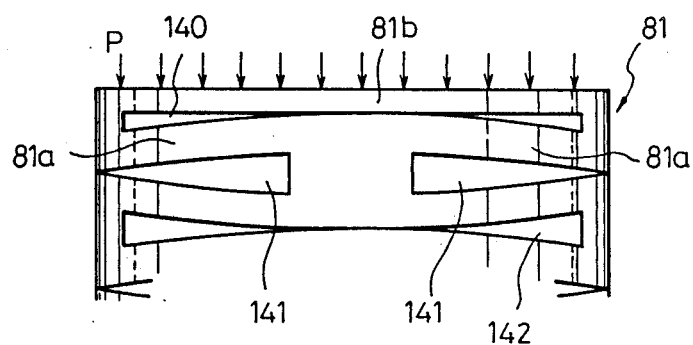

Referring to FIG. 12 and FIG. 15, which illustrates an enlarged side view of a top portion of the hollow cylindrical resilient member 81 shown in FIG. 12, the outermost slots 140 and 146 have a narrower width l than the widths m of the remaining slots 141, 142, 143, 144 and 145. In addition, the widths n between the end face of the hollow cylindrical resilient member 2 and the outermost slot 140 and between the other end face of the hollow cylindrical resilient member 2 and the outermost slot 146 are narrower than the widths O between the adjacent slots 141, 142, 143, 144, and 145. Where the widths of the slots 140 and 146 are narrow, when the axial load P is imposed on the hollow cylindrical resilient member 81, and the central portions of the upper edges of the slots 141, 142, 143, 144, 145 come into contact with the central portions of the lower edges thereof as illustrated in FIG. 15B, the central portions of the upper edges of the outermost slots 140 and 146 come into contact with the central portions of the lower edges thereof, and as a result, even when the axial load P is further increased, it is not possible for only a portion 81a of the hollow cylindrical resilient member 81, which defines the slots 140 and 146, to be excessively deformed, and thus possible damage to the hollow cylindrical resilient member 81 is prevented.

Where the widths l of the outermost slots 140 and 146 are formed to be one half of the widths of the slots 141, 142, 143, 144, 145, when the upper edges of the slots 141, 142, 143, 144, 145 come into contact with the lower edges thereof, theoretically the upper edges of the outermost slots 140, 146 will come into contact with the lower edges thereof. But, even where the widths l of the outermost slots 140 and 146 are larger than one half of the widths of the slots 141, 142, 143, 144, 145, excessive deformation of the portion 81a still can be suppressed.

Further, when the axial load P is imposed on the hollow cylindrical resilient member 81 as illustrated in FIG. 15B, the upper edge of the slot 140 and the lower edge of the slot 146 are not deformed, and thus the portions 81b between the slot 140 and one end of the hollow cylindrical resilient member 81 and between the slot 146 and the other end of the hollow cylindrical resilient member 81 do not function as a spring. Consequently, to shorten the axial length of the hollow cylindrical resilient member 81, preferably the width of the portion 81b is narrowed as much as possible, in view of the strength thereof. Therefore, in the embodiment illustrated in FIGS. 12, 13 and 15, the portion 18b is formed to have a width n which is narrower than the widths 0 between the adjacent slots 141, 142, 143, 144, 145. Further, the narrow widths l of the slots 140 and 146 allow a shortening of the axial length of the hollow cylindrical resilient member 81.

Figure 16:
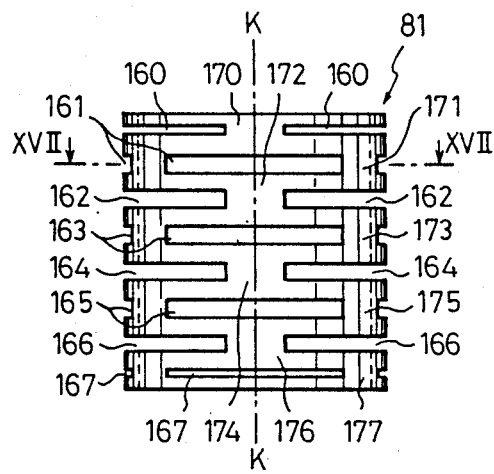
FIG. 16 is a side view of a fourth embodiment of the hollow cylindrical resilient member.
Figure 17:
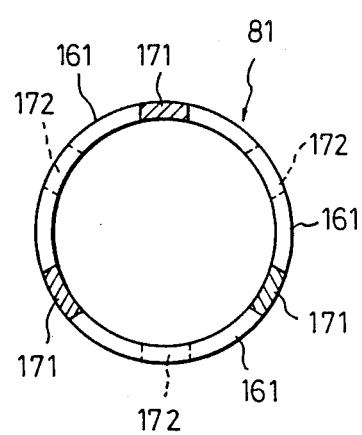
FIG. 17 is a cross-sectional plan view of the hollow cylindrical resilient member, taken along the XVII—XVII in FIG. 16.

In the embodiment illustrated in FIGS. 16 and 17, a plurality of slot groups comprising three circumferential slots which extends in the circumferential direction of the hollow cylindrical resilient member 81 are formed on the outer circumferential wall of the hollow cylindrical resilient member 81. Namely, a slot group of three circumferential slots 160, a slot group of three circumferential slots 161, a slot group of three circumferential slots 162, a slot group of three circumferential slots 163, a slot group of three circumferential slots 164, a slot group of three circumferential slots 165, a slot group of three circumferential slots 166, and a slot group of three circumferential slots 167 are formed on the outer circumferential wall of the hollow cylindrical resilient member 81. Each of the slot groups is equidistant from each of the other groups in the axial direction of the hollow cylindrical resilient member 81. Each of the slots 160, 161, 162, 163, 164, 165, 166 and 167 is extended through the wall of the hollow cylindrical resilient member 81 from the outer circumferential face thereof to the inner circumferential face thereof, and bridge portions 170, 171, 172, 173, 174, 175, 176 and 177 are formed between the slots 160, between the slots 161, between the slots 162, between the slots 163, between the slots 164 between the slots 165, between the slots 166 and between the slots 167, respectively. Each of the pair of the slots 160, 161, 162, 163, 164, 165, 166 and 167 is arranged in a point of symmetry about the central axis K of the hollow cylindrical resilient member 81, and each of the slots 160, 161, 162, 163, 164, 165, 166 and 167 is extended equiangulary about the central axis K of the hollow cylindrical resilient member 81. Consequently, each of the bridge portions 170, 171, 172, 173, 174, 175, 176 and 177 is also arranged in a point of symmetry and extended equiangulary about the central axis K of the hollow cylindrical resilient member 81. Further, the positions of the slots of the adjacent two slot groups are deviated from each other by 60° ($=180°/3$) in the embodiment illustrated in FIGS. 16 and 17. Also, in the embodiment illustrated in FIGS. 16 and 17, the slots 161, 162, 163, 164, 165, 166 other than the outermost slots 160 and 167 in the axial direction of the hollow cylindrical resilient member 81 have almost the same width, and the outermost slots 160 and 167 have a narrower width than the widths of the remaining slots 161, 162, 163, 164, 165, 166. Therefore, in this embodiment also, damage to the hollow cylindrical resilient member 81 is prevented.

Figure 18:
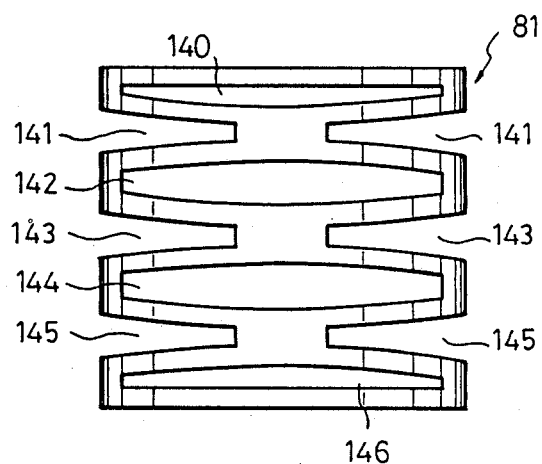
FIG. 18 is a side view of a fifth embodiment of the hollow cylindrical resilient member.

FIG. 18 illustrates an alternative embodiment shown in FIG. 14. In this embodiment, similar components are indicated by the same reference numerals as used in FIG. 14.

Referring to FIG. 18, in this embodiment, each of the slots 140, 141, 142, 143, 144, 145 and 146 has a width which is at a maximum at the central portion thereof and is gradually narrowed toward the opposed ends thereof. In this embodiment, since the widths of the central portions of the slots 140, 141, 142, 143, 144, 145 and 146 are enlarged, it is possible to increase the displacement stroke of the hollow cylindrical resilient member 81.

Figure 19:
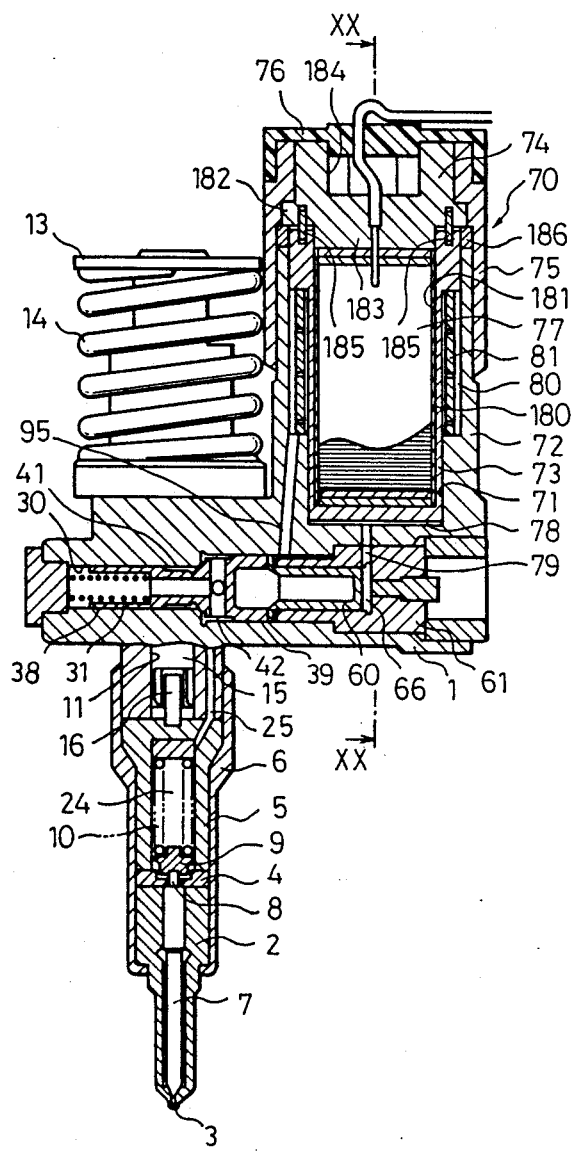
FIG. 19 is a cross-sectional side view of another embodiment of the unit injector, illustrating the same cross-section as shown in FIG. 1.
Figure 20:
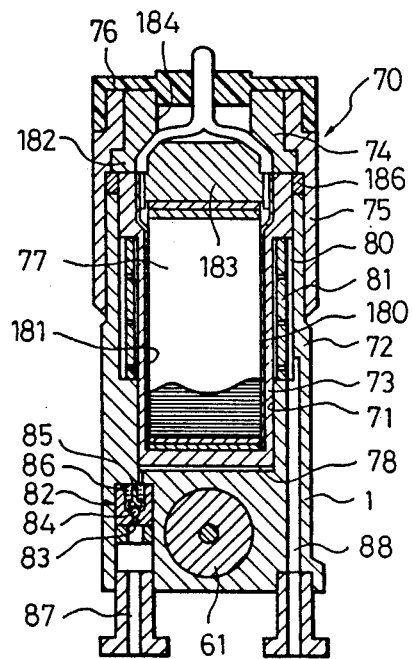
FIG. 20 is a cross-sectional side view of the unit injection, taken along the line XX—XX in FIG. 19.

FIGS. 19 and 20 illustrate an alternative embodiment of the piezoelectric actuator. In FIGS. 19 and 20, similar components are indicated by the same reference numerals as used in FIGS. 1 and 5.

Referring to FIGS. 19 and 20, in this embodiment, the piezoelectric element 77 is made of a plurality of stacked piezoelectric element plates, and the entire outer circumferential face of the piezoelectric element 77 is covered by a thermal shrink tube 180 made of a plastic. A piezoelectric element insertion bore 181 is formed in the piston 73 and extends therein in the axial direction thereof over approximately the entire length thereof. The piezoelectric element 77 is inserted into the piezoelectric element insertion bore 181 in such a way that the outer circumferential face of the thermal shrink tube 180 covering the piezoelectric element 77 is in tight contact with the inner circumferential wall of the piezoelectric element insertion bore 181. As can be seen from FIGS. 19 and 20, the entire length of the piezoelectric element 77 is smaller than the axial length of the piezoelectric element 77, and thus the piezoelectric element 77 is fully inserted into the piezoelectric element insertion bore 181, and therefore, the entire outer circumferential face of the piezoelectric element 77 is held by the inner circumferential wall of the piezoelectric element insertion bore 181, and thus none of the piezoelectric element plates will be deviated from another plate. Therefore, an eccentric load based on such a deviation of the piezoelectric element plates cannot be imposed on the piezoelectric element plates, and thus damage to the piezoelectric element 77 is prevented.

The end plate 74 has a cylindrical shape as a whole and has an annular flange 182 projecting outward at the intermediate portion thereof. Further, the end plate 74 has a reduced diameter end portion 183 at the lower end portion thereof and has a recess 184 having a hexagonal cross-section at the upper end portion thereof. The reduced diameter end portion 183 of the end plate 74 has an outer diameter substantially the same as the inner diameter of the piezoelectric element insertion bore 181 formed in the piston 73, and this reduced diameter end portion 183 is slidably inserted into the open end of the piezoelectric element insertion bore 181. Accordingly, the piezoelectric element 77 is held between the tip face of the reduced diameter end portion 183 and the deep end face of the piezoelectric element insertion bore 181. Positioning pins 87 extending within both the end plate 74 and the upper portion of the piston 73 are mounted on the upper end face of the piston 73, and the annular flange 182 of the end plate 74 is fixed to the actuator housing 72 via a seal member 186 by the end plate holder 75 screwed to the actuator housing 72.

An important factor in the application of a load to the piezoelectric element 77 is the accuracy of a right angle formed between the axis of the piezoelectric element insertion bore 181 and the deep end face of the piezoelectric element insertion bore 181, which is in contact with one end of the piezoelectric element 77, and formed between the axis of the piezoelectric element insertion bore 181 and the tip face of the reduced diameter end portion 183, which is in contact with the other end of the piezoelectric element 77. Namely, if the deep end face of the piezoelectric element insertion bore 181 or the tip face of the reduced diameter end portion 183 is only slightly inclined relative to a plane perpendicular to the axis of the piezoelectric element insertion bore 181, an eccentric load will be imposed on each of the piezoelectric element plates of the piezoelectric element 77, and thus the piezoelectric element 77 will be damaged. Accordingly, the piezoelectric element insertion bore 181 is formed by machining about the axis thereof, and thus an accurate right angle can be obtained between the deep end face of the piezoelectric element insertion bore 181 and the axis thereof. Further, the reduced diameter end portion 183 and the tip face thereof are formed by machining about the axis of the end plate 74, and thus an accurate right angle can be obtained between the tip face of the reduced diameter end portion 183 and the axis of the piezoelectric element insertion bore 181. As illustrated in FIGS. 19 and 20 the reduced diameter end portion 183 of the end plate 74 is fitted into the piezoelectric element insertion bore 181, whereby the axis of the reduced diameter end portion 183 is fully aligned with the axis of the piezoelectric element insertion bore 181, and thus an accurate right angle can be obtained between the tip face of the reduced diameter end portion 183 and the axis of the piezoelectric element insertion bore 181. As mentioned above, both the deep end face of the piezoelectric element insertion bore 181 and the tip face of the reduced diameter end portion 183 are accurately positioned at a right angle to the axis of the piezoelectric element insertion bore 181, and therefore, an eccentric load cannot be imposed on the piezoelectric element plates of the piezoelectric element 77, and thus damage to the piezoelectric element 77 is avoided.

When the end plate 74 is fixed to the actuator housing 72 by the end plate holder 75, a jig is inserted into the hexagonal cross-sectional recess 184 of the end plate 74 so that the end plate 74 and the piston 73 do not rotate when the end plate holder 75 is screwed onto the actuator housing 72.

According to the present invention, by fitting the hollow cylindrical resilient member onto the outer circumferential wall of the piston, eccentric wear of the piston and damage to the piezoelectric element are prevented.

Although the invention has been described with reference to specific embodiments chosen for purposes of illustration, it should be apparent that numerous modifications could be made thereto by those skilled in the art without departing from the basic concept and scope of the invention.

We claim:

1. A piezoelectric actuator comprising:
    a housing having a piston bore formed therein;
    a piston having a first outer wall portion slidably inserted into said piston bore and having a second outer wall portion positioned outside of said piston bore, said piston having at one side thereof an end face which defines a variable volume chamber within said piston bore;
    a piezoelectric element supported between said housing and the other side of said piston; and
    a hollow cylindrical resilient member fitted onto said second outer wall portion of said piston and inserted between said housing and said piston to apply a compression load onto said piezoelectric element via said piston, said hollow cylindrical resilient member having a plurality of slots formed on an outer circumferential wall thereof and arranged in a point of symmetry about an axis of said hollow cylindrical resilient member.

2. A piezoelectric actuator according to claim 1, wherein said hollow cylindrical resilient member has a plurality of slot groups spaced in an axial direction of said hollow cylindrical resilient member, and each slot group includes N number of said slots arranged in a point of symmetry about the axis of said hollow cylindrical resilient member, said slots included in the same slot group being deviated by 180°/N from said slots included in an adjacent slot group.

3. A piezoelectric actuator according to claim 2, wherein said slot groups are equidistant from each other in the axial direction of said hollow cylindrical resilient member.

4. A piezoelectric element according to claim 2, wherein all of said slots have a same width.

5. A piezoelectric actuator according to claim 2, wherein said slot groups comprise first outermost two groups located in the axial direction of said hollow cylindrical resilient member, and second groups located between said first groups, said slots of said second groups having a same width, and said slots of said first two groups having a width narrower than said widths of said slots of said second groups.

6. A piezoelectric actuator according to claim 5, wherein said widths of said slots of said first two groups is approximately one half the widths of said slots of said second groups.

7. A piezoelectric actuator according to claim 2, wherein said hollow cylindrical resilient member comprises a first portion located between an axial end face thereof and said outermost slot group located in the axial direction of said hollow cylindrical resilient member, and second portions located between adjacent slot groups, said first portion having a width narrower than the widths of said second portions.

8. A piezoelectric actuator according to claim 2, wherein the widths of said slots become gradually narrower toward opposite ends thereof.

9. A piezoelectric actuator according to claim 1, wherein said housing and said second outer wall of said piston defines a cooling chamber therebetween, and said hollow cylindrical resilient member is arranged in said cooling chamber.

10. A piezoelectric actuator according to claim 9, wherein said cooling chamber and said variable volume chamber are filled with fuel.

11. A piezoelectric actuator according to claim 1, wherein said piston has a piezoelectric element insertion bore formed therein, and said piezoelectric element is fitted into said piezoelectric element insertion bore.

12. A piezoelectric actuator according to claim 11, wherein an entire outer circumferential wall of said piezoelectric element is covered by a thermal shrink tube.

13. A piezoelectric actuator according to claim 11, wherein said piezoelectric element insertion bore has a deep end face at one end thereof and an open end at the other end thereof, and said open end is covered by an end plate supported by said housing, said piezoelectric element being supported between said deep end face and said end plate.

14. A piezoelectric actuator according to claim 13, wherein said end plate has a reduced diameter end portion fitted into said open end of said piezoelectric element insertion bore and a tip end face extended perpendicular to an axis of said piezoelectric element insertion bore, and said piezoelectric element is supported between said deep end face of said piezoelectric element insertion bore and said tip end face of said end plate.

15. A piezoelectric actuator according to claim 13, wherein said piston is axially movably connected to said end plate by a positioning pin extended within both said piston and said end plate.

* * * * *

UNITED STATES PATENT AND TRADEMARK OFFICE
CERTIFICATE OF CORRECTION

PATENT NO. : 4,958,101

DATED : September 18, 1990

INVENTOR(S) : Takeshi TAKAHASHI, et al.

It is certified that error appears in the above-identified patent and that said Letters Patent is hereby corrected as shown below:

Column 2, line 46, change "airconferential" to --circumferential--.

Column 2, line 52, change "accorm-" to --accom---.

Column 3, line 24, between "the" and "XVII-X" insert --line--.

Column 7, lines 41 and 45, change "equiangulary" to --equiangularly--.

Column 7, line 55, change "illustrates" to --illustrate--.

Column 8, lines 15 and 19, change "equiangulary" to --equiangularly--.

Column 11, line 60, change "slot" to --slots--.

Column 12, lines 19 and 23, change "equiangulary" to --equiangularly--.

UNITED STATES PATENT AND TRADEMARK OFFICE
CERTIFICATE OF CORRECTION

PATENT NO. : 4,958,101

DATED : September 18, 1990

INVENTOR(S) : Takeshi TAKAHASHI, et al.

It is certified that error appears in the above-identified patent and that said Letters Patent is hereby corrected as shown below:

Column 24, line 23, change "equiangulary" to --equiangularly--.

Column 17, line 5, change "is" to --are--.

Signed and Sealed this

Seventeenth Day of March, 1992

Attest:

HARRY F. MANBECK, JR.

*Attesting Officer*     *Commissioner of Patents and Trademarks*